(12) United States Patent
Han

(10) Patent No.: US 7,898,872 B2
(45) Date of Patent: Mar. 1, 2011

(54) OPERATING METHOD USED IN READ OR VERIFICATION METHOD OF NONVOLATILE MEMORY DEVICE

(75) Inventor: Jung Chul Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 69 days.

(21) Appl. No.: 12/472,678

(22) Filed: May 27, 2009

(65) Prior Publication Data

US 2010/0182844 A1 Jul. 22, 2010

(30) Foreign Application Priority Data

Jan. 21, 2009 (KR) ................... 2009-5072

(51) Int. Cl.
G11C 11/34 (2006.01)
G11C 16/04 (2006.01)
G11C 16/06 (2006.01)

(52) U.S. Cl. ............... 365/185.25; 365/185.17; 365/185.18; 365/185.2; 365/185.22; 365/203

(58) Field of Classification Search ............. 365/185.2, 365/185.17, 185.22, 185.25, 203
See application file for complete search history.

(56) References Cited

U.S. PATENT DOCUMENTS

2008/0198654 A1* 8/2008 Toda ............... 365/185.03

2009/0310405 A1* 12/2009 Lee et al. ............... 365/185.2

FOREIGN PATENT DOCUMENTS

KR 1020080090841 10/2008

OTHER PUBLICATIONS

Notice of Allowance issued from Korean Intellectual Property Office on Oct. 22, 2010.

* cited by examiner

Primary Examiner—Ly D Pham
(74) Attorney, Agent, or Firm—IP & T Group LLP

(57) ABSTRACT

In an operating method in a read or verification operation of a nonvolatile memory device, selected bit lines are precharged to a logic high level and, at the same time, unselected bit lines are discharged to a logic low level. The selected and unselected bit lines are connected to respective memory cell strings and, concurrently, word lines are supplied with a pass voltage. The connection between the selected and unselected bit lines and the respective memory cell strings is shut off and, concurrently, a selected word line is supplied with a ground voltage. The selected and unselected bit lines and the respective memory cell strings are coupled together and, concurrently, a selected word line is supplied with a reference voltage and an unselected word line is supplied with the pass voltage.

25 Claims, 7 Drawing Sheets

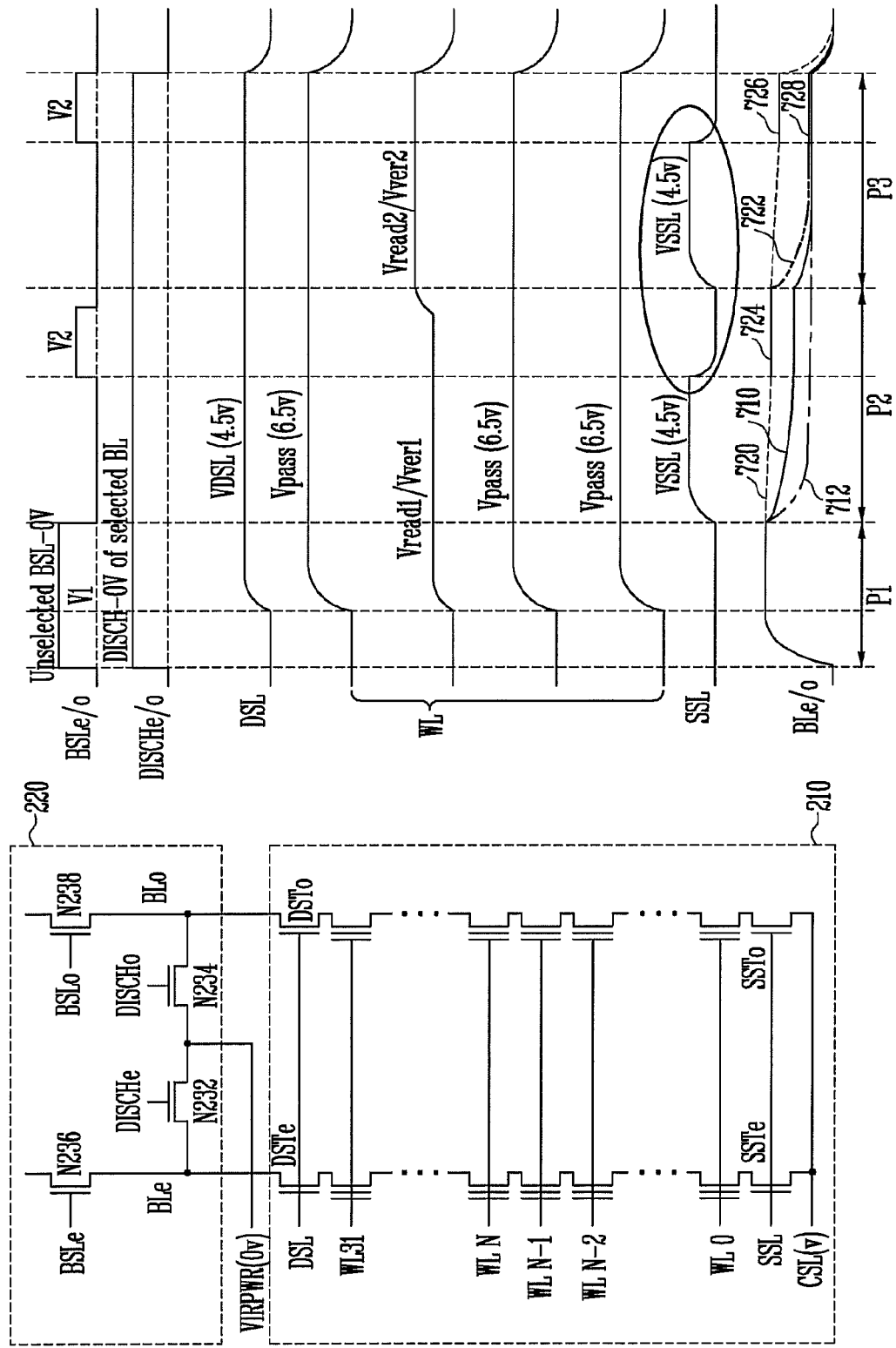

OPERATING METHOD USED IN READ OR VERIFICATION METHOD OF NONVOLATILE MEMORY DEVICE

CROSS-REFERENCES TO RELATED APPLICATIONS

The present application claims priority to Korean patent application number 10-2009-0005072, filed on Jan. 21, 2009, the disclosure of which is incorporated herein by reference in its entirety.

BACKGROUND

One or more embodiments relate to an operating method used in a read or verification method of a nonvolatile memory device.

In recent years, there is an increasing demand for nonvolatile memory devices which can be electrically programmed and erased and do not need the refresh function of rewriting data at specific intervals.

The nonvolatile memory cell is an element enabling electrical program/erase operations, and is configured to perform the program and erase operations by changing its threshold voltage as electrons are migrated by a strong electric field applied to a thin oxide layer.

In such a nonvolatile memory device, a read operation and a verification operation are performed in a similar way. In the state in which a bit line coupled to a cell to be read is precharged to a logic high level, a read operation or a verification operation is performed by supplying the word line of the cell to be read with a reference voltage to and turning off the remaining memory cells. If the threshold voltage level of the memory cell is higher than the reference voltage, the corresponding memory cell is turned off, so the voltage level of the bit line remains intact. However, if the corresponding memory cell is turned on because the threshold voltage level of the memory cell is lower than the reference voltage, the voltage of the bit line is discharged through a common source line of a ground state. That is, whether or not the threshold voltage of the cell to be read is higher than the reference voltage can be determined based on a change in the voltage level of the bit line.

In accordance with the read operation or the verification operation, if the threshold voltage of a memory cell coupled to an unselected bit line, which belongs to memory cells to which selected read/verification reference voltages are applied, is higher than the reference voltage, the corresponding memory cell is turned off, so two channels with different electrical properties are formed on the basis of the corresponding memory cell. That is, the voltage of a channel formed in memory cells coupled to a variable voltage input terminal of a ground state maintains 0 V. However, a channel formed in memory cells coupled between the memory cell and a source select transistor of a turned-off state remains in a floating state. Accordingly, there is a probability that the threshold voltage of the memory cells may rise because of a voltage applied to the gates of the memory cells.

Since a high pass voltage is applied to the gates of the memory cells, charges moved by a strong electric field may move to the floating gates because of a channel hot carrier injection (CHEI) phenomenon. Consequently, there is a possibility that the threshold voltage of the corresponding cells may rise. In particular, there is a probability that this phenomenon may worsen when the memory cells are in an erase state. This phenomenon is called "disturbance occurring during a read or verification operation."

Meanwhile, in the case where the verification method is applied to a multi-level cell program method, the following problems may occur. In the multi-level cell program method, the voltage level of a bit line is evaluated on the basis of two or more different reference voltages. This evaluation is sequentially performed. Accordingly, in the case where, after the bit line is precharged once, two or more steps of sequentially evaluating the voltage level of the bit line are performed, in the steps subsequent to the second evaluation step, the voltage level of the bit line may vary because of external factors, such as the leakage current occurring in the bit line. Accordingly, a cell may be read as being programmed with a voltage lower than an actual threshold voltage, or a cell may be read as being programmed with a voltage higher than an actual threshold voltage. In particular, in a verification operation, over-program or under-program may occur owing to the measurement results.

BRIEF SUMMARY

One or more embodiments are directed towards an operating method used in a read or verification method of a nonvolatile memory device, which is capable of preventing a read disturbance phenomenon occurring in memory cells coupled to an unselected bit line when a read or verification operation is performed.

One or more embodiments are directed towards an operating method used in a read or verification method of a nonvolatile memory device, which is capable of preventing a phenomenon in which a threshold voltage is measured differently from an actual threshold voltage when a read or verification operation of a nonvolatile memory device to which a multi-level cell program method is applied is performed.

In an embodiment, an operating method used in a read or verification operation of a nonvolatile memory device includes precharging selected bit lines to a logic high level and, concurrently, discharging unselected bit lines to a logic low level, coupling the selected and unselected bit lines to respective memory cell strings and, concurrently, supplying word lines with a pass voltage, shutting off the connection between the selected and unselected bit lines and the respective memory cell strings and, concurrently, supplying a selected word line with a ground voltage, and coupling the selected and unselected bit lines and the respective memory cell strings and, concurrently, supplying a selected word line with a reference voltage and an unselected word line with the pass voltage.

In another embodiment, an operating method used in a read or verification operation of a nonvolatile memory device includes precharging first bit lines to a logic high level and, concurrently, discharging second bit lines to a logic low level, coupling the first and second bit lines to respective memory cell strings and, concurrently, supplying word lines with a pass voltage, shutting off the connection between the first and second bit lines and the respective memory cell strings and, concurrently, supplying a selected word line with a ground voltage, and coupling the first and second bit lines and the respective memory cell strings and, concurrently, supplying a selected word line with a reference voltage and an unselected word line with the pass voltage.

In yet another embodiment, an operating method used in a read or verification method of a nonvolatile memory device includes coupling selected bit lines and a sensing node of a logic high level so that the selected bit lines are precharged, coupling the selected bit lines and respective memory cell strings and, concurrently, supplying a selected word line with a first reference voltage and an unselected word line with a pass voltage, a first evaluation step of shutting off the connection between the selected bit lines and the sensing node, coupling each of the memory cell strings and a common source line of a ground state, and evaluating a voltage level of a bit line coupled to a cell to be read according to a threshold voltage of the cell, coupling the bit lines and a sensing node of a floating state, shutting off the connection between each of the memory cell strings and the common source line, and sensing a voltage level of the sensing node according to the voltage level of the bit line evaluated in the first evaluation step, and a second evaluation step of shutting off the connection between the selected bit lines and the sensing node, supplying the selected word line with a second reference voltage, coupling each of the memory cell strings and the common source line of a ground state, and evaluating a voltage level of a bit line coupled to a cell to be read according to a threshold voltage of the cell, and coupling the bit lines and the sensing node of a floating state, shutting off the connection between each of the memory cell strings and the common source line, and sensing a voltage level of the sensing node according to the voltage level of the bit line evaluated in the second evaluation step.

BRIEF DESCRIPTION OF THE DRAWINGS

FIG. 7 is a diagram illustrating a read operation or a verification operation of the nonvolatile memory device according to another embodiment.

DESCRIPTION OF SPECIFIC EMBODIMENT

Hereinafter, the present disclosure will be described in detail in connection with one or more embodiments with reference to the accompanying drawings. The figures are provided to facilitate understanding by those having ordinary skill as to the full scope of one or more embodiments of the disclosure.

Figure 1:
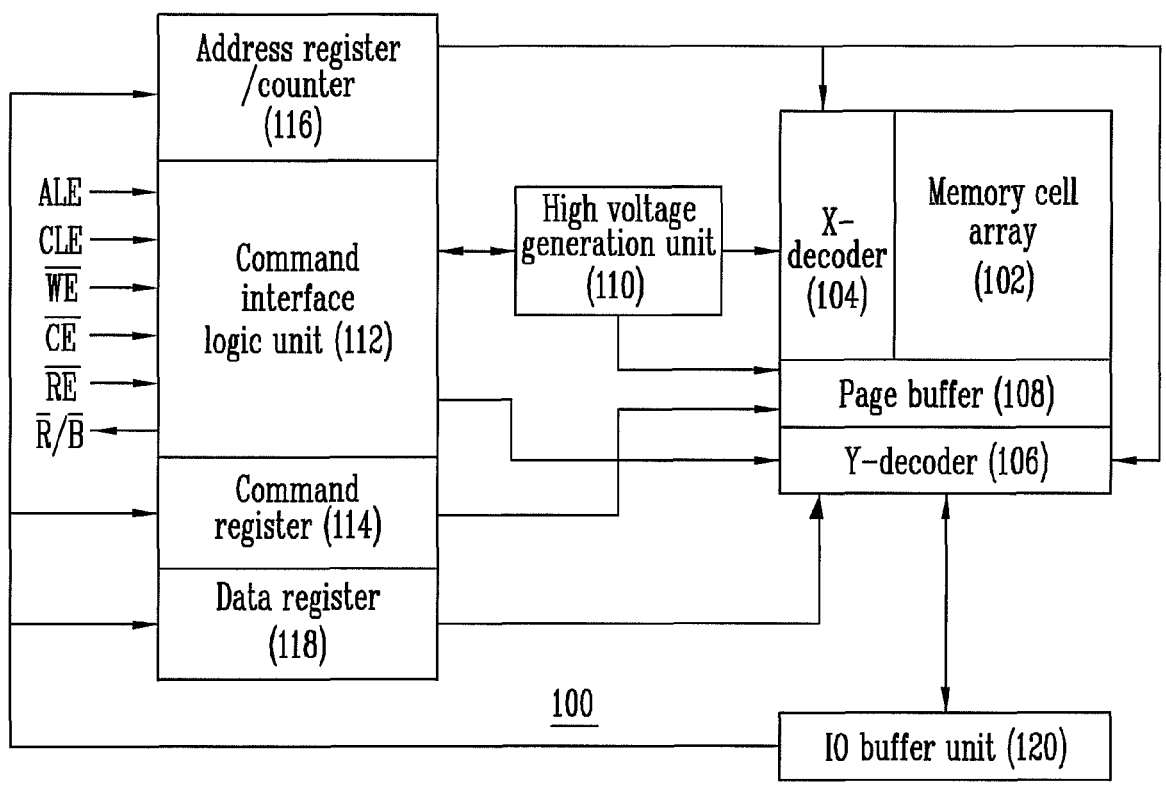
FIG. 1 is a diagram showing a nonvolatile memory device to which one or more embodiments of the disclosure are applied.

FIG. 1 is a diagram showing a nonvolatile memory device to which one or more embodiments of the invention are applied.

The nonvolatile memory device 100 includes a memory cell array 102, a page buffer 108, X/Y decoders 104 and 106, a high voltage generation unit 110, a command interface logic unit 112, a command register 114, an address register/counter 116, a data register 118, and an IO buffer unit 120.

The operation of the nonvolatile memory device is described below.

First, when a chip enable signal /CE is disabled and a write enable signal /WE is toggled for the command interface logic unit 112, the command interface logic unit 112 is configured to receive a command signal via the IO buffer unit 120 and the command register 114 and generates a program command, an erase command or a read command in response to the command signal. Here, the command signal includes a page program setup code to determine an operation mode used in a read or verification method of the nonvolatile memory device. Meanwhile, an operating state signal /R/B output from the command interface logic unit 112 is disabled for a certain period of time. An external memory controller (not shown) receives the operating state signal /R/B and recognizes that the nonvolatile memory device is in an operating state, such as program, erase, or read. That is, while the operating state signal /R/B is disabled, a program, erase, or read operation for one page of a memory cell array is performed.

Furthermore, the address register/counter 116 receives an address signal via the IO buffer unit 120 and generates a row address signal and a column address signal. The address signal corresponds to one of pages included in the memory cell array.

The data register 118 is configured to temporarily store various data received via the IO buffer unit 120 and transfer the data to the Y-decoder 106.

The high voltage generation unit 110 is configured to generate bias voltages in response to a program command, an erase command, or a read command and supplies the bias voltages to the page buffer 108, the X-decoder 104, and so on.

The X-decoder 104 is configured to supply the memory cell array 102, belonging to one of blocks of the memory cell array, with the bias voltages in response to the row address signal.

The Y-decoder 106 is configured to supply a data signal to bit lines (not shown), shared by the blocks of the memory cell array, via the page buffer 108 in response to the column address signal.

The page buffer 108 is configured to latch the data signal received via the IO buffer unit 120 and the Y-decoder 106 and output the data signal to the bit lines (not shown) shared by the blocks of the memory cell array.

Figure 2:
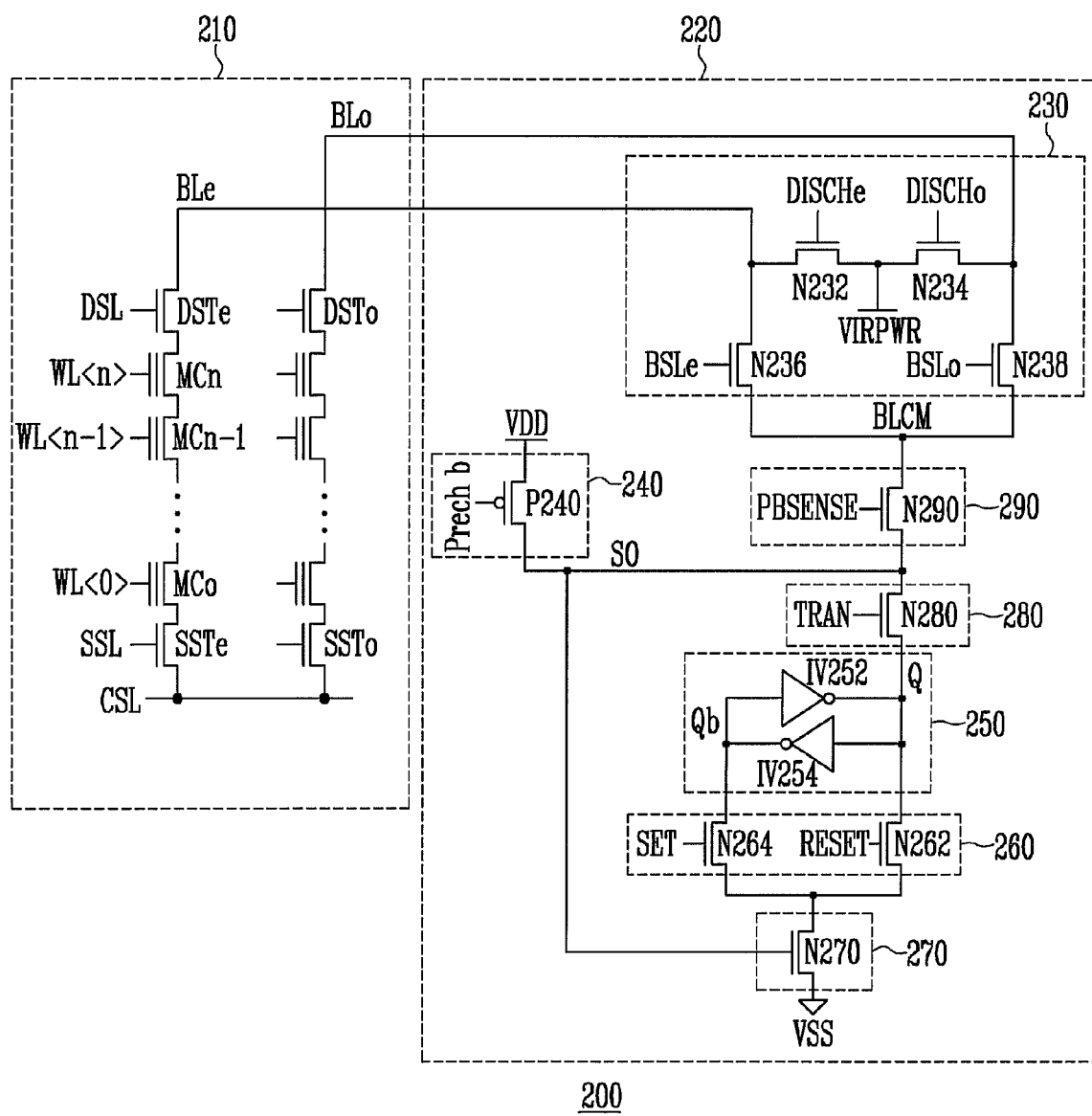
FIG. 2 is a diagram showing a memory cell array and a page buffer of a known nonvolatile memory device.

FIG. 2 is a diagram showing the construction of the memory cell array and the page buffer of a known nonvolatile memory device.

The nonvolatile memory device 200 includes a memory cell array 210 having a number of memory cells, and a page buffer 220 coupled to the memory cells and configured to program specific data into the memory cells or read data stored in the memory cells.

The memory cell array 210 includes memory cells MC0-MCn configured to store data, word lines WL<0:n> configured to select and enable the memory cells, and bit lines BLe and BLo configured to input or output data of the memory cell. The memory cell array 210 has a structure in which a number of the word lines and a number of the bit lines are arranged in a matrix form. The memory cell array 210 includes drain select transistors DSTe and DSTo coupled between the bit lines and the memory cells, and source select transistors SSTe and SSTo coupled between a common source line CSL and the memory cells. Groups of the memory cells are coupled in series between the source select transistors SSTe and SSTo and the drain select transistors DSTe and DSTo. A group of the memory cells is called a cell string. The gates of the memory cells are coupled to the word lines, and a set of the memory cells commonly coupled to the same word line is called a page. A number of the cell strings coupled to respective bit lines are coupled in parallel to the common source line CSL, thus forming a memory cell block.

The page buffer 220 includes a bit line select unit 230, a sensing node precharge unit 240, a data latch unit 250, a data setting unit 260, a sensing node sensing unit 270, a data transfer unit 280, a data transfer unit 280, and a bit line sensing unit 290.

The bit line select unit 230 is configured to selectively connect a bit line, coupled to specific cells, to a sensing node SO. The sensing node precharge unit 240 is configured to supply the sensing node with the power supply voltage of a logic high level. The data latch unit 250 is configured to temporarily store data to be programmed into a specific cell or temporarily store data read from a specific cell. The data setting unit 260 is configured to input data to be stored in the data latch unit 250. The sensing node sensing unit 270 is configured to supply a specific node of the data latch unit 250 with a ground voltage according to the level of the sensing node. The data transfer unit 280 is configured to supply data, stored in the data latch unit, to the sensing node. The bit line sensing unit 290 is configured to transfer the voltage level of a bit line to the sensing node according to the state of a memory cell during a verification or read operation.

The bit line select unit 230 includes an NMOS transistor N236 configured to couple the even bit line BLe and the sensing node SO in response to a first bit line select signal BSLe and an NMOS transistor N238 configured to couple the odd bit line BLo and the sensing node SO in response to a second bit line select signal BSLo. The bit line select unit 230 further includes a variable voltage input terminal configured to apply a variable voltage VIRPWR of a specific level, an NMOS transistor N232 configured to couple the even bit line BLe and the variable voltage input terminal in response to a first discharge signal DISCHe, and an NMOS transistor N234 configured to couple the odd bit line BLo and the variable voltage input terminal in response to a second discharge signal DISCHo. Meanwhile, according to an embodiment, a construction that does not include the bit line sensing unit 290 is possible. In this case, the NMOS transistors N236 and N238 function as the bit line sensing unit 290.

The sensing node precharge unit 240 is configured to supply the sensing node SO with a high-level voltage VDD in response to a precharge signal Prech b. To this end, the sensing node precharge unit 240 includes a PMOS transistor P240 coupled between the power supply voltage terminal VDD and the sensing node SO. Accordingly, the sensing node precharge unit 240 applies a power supply voltage of a logic high level to the sensing node SO in response to the precharge signal of a logic low level.

The data latch unit 250 is configured to temporarily store data to be programmed into a specific cell or temporarily store data read from a specific cell. To this end, the data latch unit 250 includes a first inverter IV252 and a second inverter IV254. The output terminal of the first inverter IV252 is coupled to the input terminal of the second inverter IV254, and the output terminal of the second inverter IV254 is coupled to the input terminal of the first inverter IV252. Here, an intervening node of the output terminal of the first inverter IV252 and the input terminal of the second inverter IV254 is called a first node Q, and an intervening node of the output terminal of the second inverter IV254 and the input terminal of the first inverter IV252 is called a second node Qb.

The data setting unit 260 includes a first data setting transistor N262 configured to apply a ground voltage to the first node Q of the data latch unit 250 and a second data setting transistor N264 configured to supply the second node Qb with a ground voltage. The first data setting transistor N262 is coupled between the sensing node sensing unit 270 and the first node Q and is configured to supply the first node Q with the ground voltage, transferred by the sensing node sensing unit 270, in response to a first data setting signal RESET.

Furthermore, the second data setting transistor N264 is coupled between the sensing node sensing unit 270 and the second node Qb and is configured to supply the second node Qb with the ground voltage, transferred by the sensing node sensing unit 270, in response to a second data setting signal SET.

The sensing node sensing unit 270 is configured to supply the data setting unit 260 with the ground voltage according to a voltage level of the sensing node SO. To this end, the sensing node sensing unit 270 includes an NMOS transistor N270 coupled between the data setting unit 260 and the ground terminal VSS. Accordingly, the sensing node sensing unit 270 applies the ground voltage to the data setting unit 260 according to a voltage level of the sensing node SO. Only when a voltage level of the sensing node is in a logic high level, the sensing node sensing unit 270 applies the ground voltage to the data setting unit 260. At this time, when the first data setting signal RESET of a logic high level is applied, the ground voltage is applied to the first node Q. In this case, it is considered that low-level data has been applied to the first node Q. However, when the second data setting signal SET of a logic high level is applied, the ground voltage is applied to the second node Qb. In this case, it is considered that high-level data has been applied to the first node Q.

The data transfer unit 280 is configured to selectively supply the sensing node SO with data stored in the first node Q of the data latch unit 250. To this end, the data transfer unit 280 includes a data transfer transistor N280 configured to selectively couple the first node Q and the sensing node SO in response to a data transfer signal TRAN.

The bit line sensing unit 290 includes an NMOS transistor N290 coupled between the bit line select unit 230 and the sensing node SO. The bit line sensing unit 290 is configured to couple a bit line common node BLCM and the sensing node SO in response to a bit line sensing signal PBSENSE of a logic high level and evaluate the voltage level of a specific bit line so that the voltage level of data stored in the specific cell is applied to the sensing node SO. Here, a first voltage V1 or a second voltage V2 lower than the first voltage is applied as voltage of a sensing signal. That is, a read or verification operation is performed according to a voltage level of the bit line sensing signal PBSENSE applied to the gate of the NMOS transistor N290. Meanwhile, according to an embodiment, a construction that does not include the bit line sensing unit 290 is possible. In this case, the NMOS transistors N236 and N238 function as the bit line sensing unit 290. That is, the same operation can be performed by applying the first or second bit line select signal BSLe or BSLo having the first voltage V1 or the second voltage V2 lower than the first voltage.

The page buffer 220 shown in FIG. 2 is an exemplary embodiment that shows various exemplary operations performed on a page buffer, and it will be evident to those having ordinary skill in the art that the page buffer 220 may be modified in various ways. For example, a page buffer may include a number of the data latch units 250 configured to store data.

A read operation or a verification operation performed in the above-described nonvolatile memory device is described below.

Figure 3:
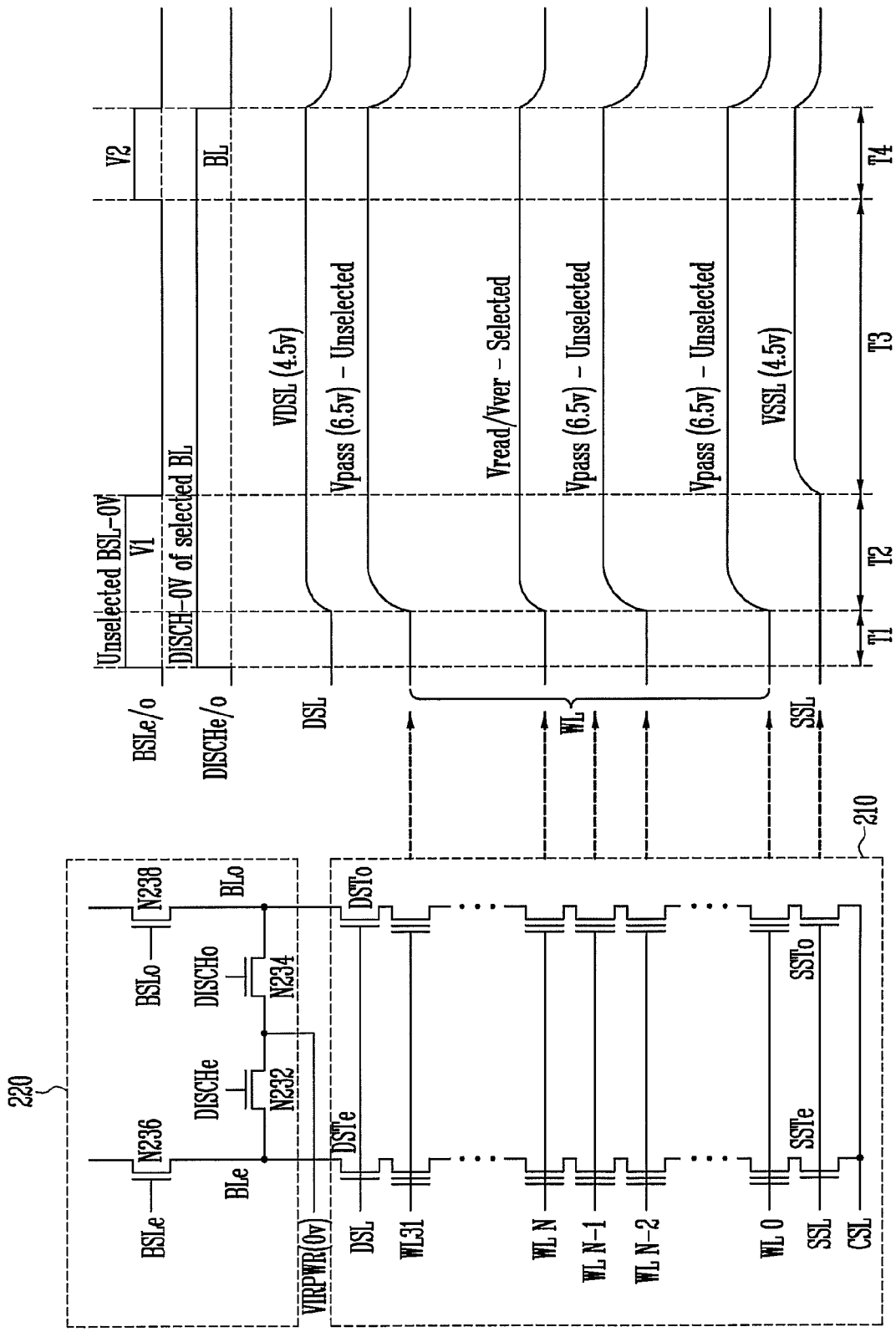
FIG. 3 is a diagram illustrating a verification operation or a read operation of the known nonvolatile memory device.

FIG. 3 is a diagram illustrating a verification operation or a read operation of the known nonvolatile memory device.

The diagram of FIG. 3 corresponds to a construction in which the bit line sensing unit 290 is omitted. In FIG. 3, a read or verification operation is performed by applying the first or second bit line select signal BSLe or BSLo having a first voltage V1 or a second voltage V2 lower than the first voltage V1. In the case of a construction including the bit line sensing unit 290, the read or verification operation may be performed by applying the bit line sensing signal PBSENSE having a first voltage V1 or a second voltage V2 lower than the first voltage V1. Here, in the case where the bit line sensing unit 290 is used, a bit line (i.e., the subject of verification/read) is selected by the first or second bit line select signal BSLe or BSLo.

In other words, in a construction that does not include the bit line sensing unit 290, the bit line select signals BSLe and BSLo serve both a function of selecting a bit line and a function of a sensing signal during read/verification operations. However, in a construction including the bit line sensing unit 290, the bit line select signal BSLe or BSLo serves the bit line selection function, and the bit line sensing signal PBSENSE serves the function of a sensing signal during the read/verification operations.

(1) Period T1

First, a bit line coupled to a cell to be read/verified (i.e., a selected bit line) is precharged to a logic high level. To this end, the sensing node SO is coupled to the power supply voltage terminal using the sensing node precharge unit 240. The selected bit line coupled to the cell to be read/verified is precharged to a logic high level (V1−Vth) (Vth is the threshold voltage of the NMOS transistor N236 or N238) by applying the bit line select signal BSLe or BSLo having the first voltage V1. At this time, a connection between the sensing node of a logic high level and an unselected bit line is shut off by supplying the NMOS transistor N236 or N238, coupled to the unselected bit line, with the bit line select signal BSLe or BSLo of a logic low level. Meanwhile, in a construction including the bit line sensing unit 290, the selected bit line is precharged by applying the bit line sensing signal PBSENSE having the first voltage V1.

An unselected bit line is coupled to the variable voltage input terminal VIRPWR to which the ground voltage is applied by applying the discharge signal DISCHe or DISCHo of a logic high level. That is, the unselected bit line remains in a logic low level. At this time, a connection between a selected bit line and the variable voltage input terminal VIRPWR is shut off by supplying the NMOS transistor N232 or N234, coupled to the selected bit line, with the discharge signal DISCHe or DISCHo of a logic low level.

In general, read/verification operations are independently performed on memory cells coupled to even bit lines and memory cells coupled to odd bit lines. Accordingly, in the case where read/verification operations are performed on even bit lines, the even bit lines are precharged to a logic high level, but odd bit line is discharged to a logic low level. Furthermore, in the case where read/verification operations are performed on odd bit lines, the odd bit lines are precharged to a logic high level, but even bit lines are discharged to a logic low level.

(2) Period T2

Next, the bit line precharged to the logic high level is coupled to a cell string including the cell to be read/verified. To this end, the drain select transistor DSTe or DSTo is turned on by supplying the drain select transistor with the drain select signal DSL of a logic high level so that the bit line is coupled to the cell string. At this time, a read/verification reference voltage Vread or a pass voltage Vpass may be applied to each of word lines depending on the subject of read/verification. That is, a read reference voltage Vread or a verification reference voltage Vver (i.e., the criterion of read/verification operations) is applied to a word line including a cell to be read/verified, and the pass voltage Vpass is applied to the remaining word lines so that all memory cells coupled to the corresponding word lines are turned on irrespective of the states of the corresponding memory cells.

Accordingly, unselected memory cells are all turned on, and whether to turn on selected memory cells is determined according to the threshold voltages of the corresponding memory cells.

(3) Period T3

The application of the bit line select signal BSLe or BSLo having the first voltage or of the bit line sensing signal PBSENSE is stopped, and the voltage level of the bit line is changed according to a state of the cell to be read/verified. Since the supply of the bit line select signal BSLe or BSLo or the bit line sensing signal PBSENSE is stopped, a connection between the bit line and the sensing node coupled to the power supply voltage terminal is shut off. Accordingly, the selected bit line becomes a logic high level and therefore remains in its floated state. At this time, the source select transistor SSTe or SSTo is turned on by supplying the source select transistor with the source select signal SSL of a logic high level so that the cell string is coupled to the common source line CSL.

In the case where the threshold voltage of a cell to be read/verified is lower than a read/verification reference voltage, the corresponding cell is turned on, so the voltage level of a bit line coupled to the cell is discharged to a logic low level. Unselected cells have already been turned on by a pass voltage Vpass, and the cell to be read/verified is turned on. Accordingly, the voltage level of the bit line is discharged to a logic low level through the common source line connected to the ground.

In contrast, in the case where the threshold voltage of the cell to be read/verified is higher than the read/verification reference voltage, the corresponding cell is turned off, so the voltage level of the bit line remains in a logic high level. That is, the formation of a current path is shut off because the cell to be read/verified is turned off, so that the voltage level of the bit line remains in a logic high level.

(4) Period T4

Next, the state of the memory cell is stored in the data latch unit 250 by applying the bit line select signal BSLe or BSLo or the bit line sensing signal PBSENSE having the second voltage V2.

In the case where the cell to be read/verified has been programmed with the reference voltage or more in the period T3, the voltage level of the bit line remains in the precharged voltage level (V1−Vth). In the case where the cell to be read/verified has not been programmed with the reference voltage or more, the voltage level of the bit line shifts to a logic low level.

If the bit line select signal BSLe or BSLo or the bit line sensing signal PBSENSE having the second voltage V2 lower than the first voltage V1 is applied, whether the NMOS transistor N236, N238, or N290 to which the corresponding signal is applied will be turned on is determined according to the voltage level of a bit line. Here, although not shown in the drawing, prior to the start of a fourth period T4, an operation of stopping the operation of the sensing node precharge unit 240 so that the sensing node floats in a logic high level may be first performed.

If the voltage level of the bit line shifts to a logic low level because the cell to be read/verified has not been programmed with the reference voltage or more, the NMOS transistor N236, N238, or N290 is turned on by the supply of the second voltage V2 and the sensing node SO of a floating state shifts to the ground through the grounded common source line CSL.

However, if the voltage level of the bit line remains in the logic high level because the cell to be read/verified has been programmed with the reference voltage or more, the NMOS transistor N236, N238, or N290 is turned off despite the supply of the second voltage V2, so the sensing node SO floated in a logic high level remains in the logic high level.

Referring to FIG. 2, if the sensing node SO shifts to the ground because the cell to be read/verified has not been programmed with the reference voltage or more, the sensing node sensing unit 270 is not driven.

However, if the sensing node SO remains in a logic high level because the cell to be read/verified has been programmed with the reference voltage or more, the sensing node sensing unit 270 is driven, thus being capable of transferring a ground voltage to the data setting unit 260. Accordingly, data stored in the first node Q can be changed.

One or more embodiments may avoid concerns in read/verification operations.

Figure 4:
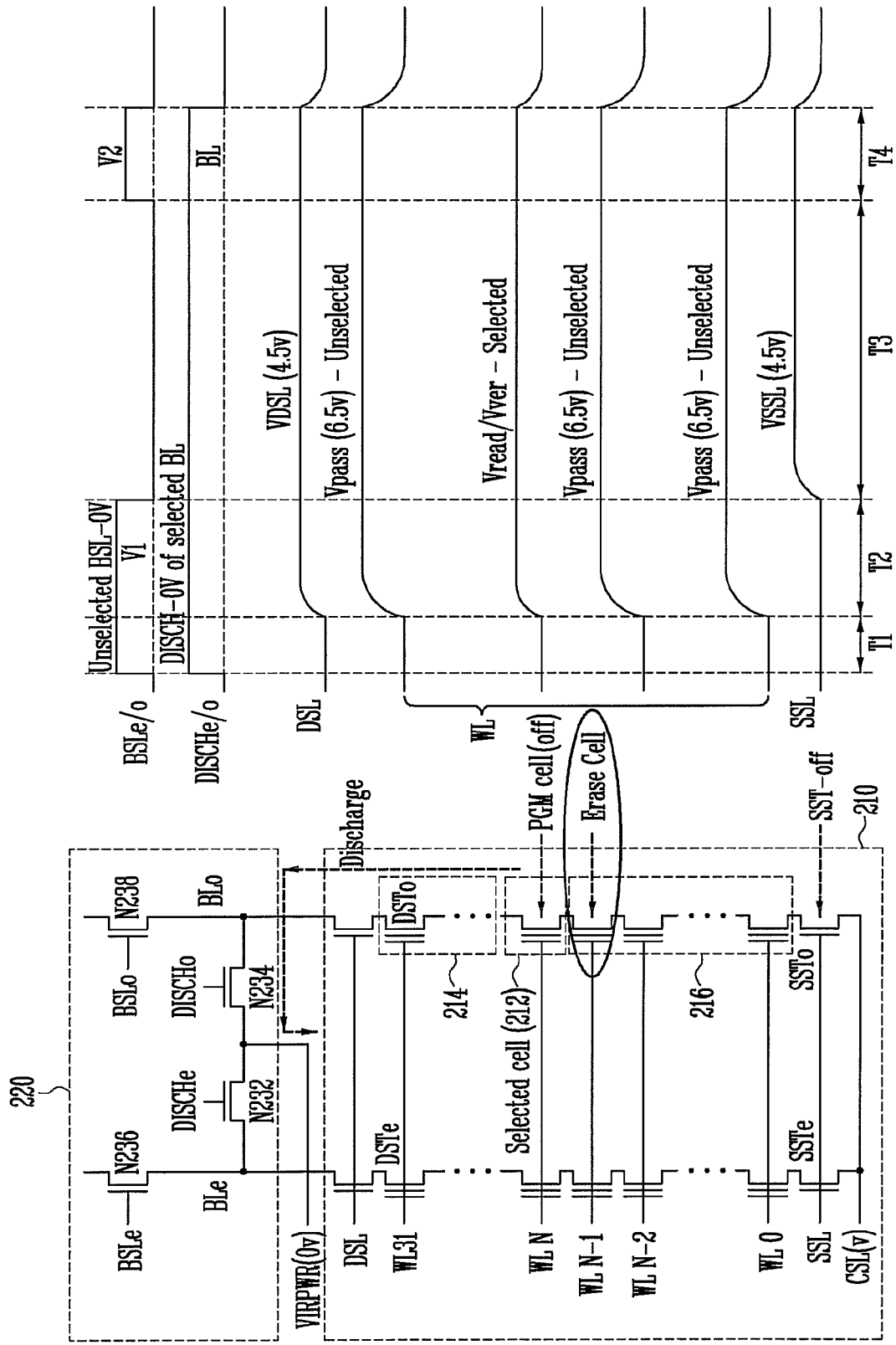
FIG. 4 is a diagram illustrating a problem occurring in the verification operation or the read operation of the known nonvolatile memory device.

FIG. 4 is a diagram illustrating a problem occurring in the verification operation or the read operation of a known nonvolatile memory device.

In the drawings, an even bit line is a bit line coupled to a cell to be read/verified (i.e., a selected bit line).

Accordingly, the even bit line is precharged to a logic high level, and an odd bit line is grounded (period T1).

Next, the precharged bit line is coupled to a cell string, and the reference voltage or the pass voltage is applied to each of word lines (period T2).

At this time, the reference voltage or the pass voltage is also applied to cells connected to an unselected bit line, and whether a memory cell 212 to which the reference voltage is applied, which belongs to the cells coupled to the unselected bit line, will be turned on is determined according to the threshold voltage of a corresponding cell.

In other words, when the threshold voltage of the memory cell 212 connected to the unselected bit line, which belongs to memory cells to which the read/verification reference voltages are applied, is lower than the reference voltage, the corresponding cell is also turned on.

In contrast, when the threshold voltage of the memory cell 212 connected to the unselected bit line, which belongs to the memory cells to which the read/verification reference voltages are applied, is higher than the reference voltage, the corresponding cell is turned off, so two channels 214 and 216 with different electrical properties/conductive states are formed on the basis of the corresponding cell. That is, the voltage of the channel formed in the memory cells 214 coupled to the variable voltage input terminal of a ground state maintains 0 V. However, the channel formed in the memory cells 216 coupled between the memory cell 212 and the source select transistor SST of a turned-off state remains in a floating state. Accordingly, there is a probability that the threshold voltages of the memory cells 216 may rise because of voltage applied to the gates of the memory cells 216.

Since a high pass voltage is applied to the gates of the memory cells 216, charges moved by a strong electric field may move to the floating gate by a channel hot carrier injection (CHEI) phenomenon. Consequently, there is a probability that the threshold voltages of the corresponding cells may increase. In particular, when the memory cells 216 are in an erase state, this phenomenon may worsen. This phenomenon is called "disturbance occurring during a read or verification operation".

Figure 5:
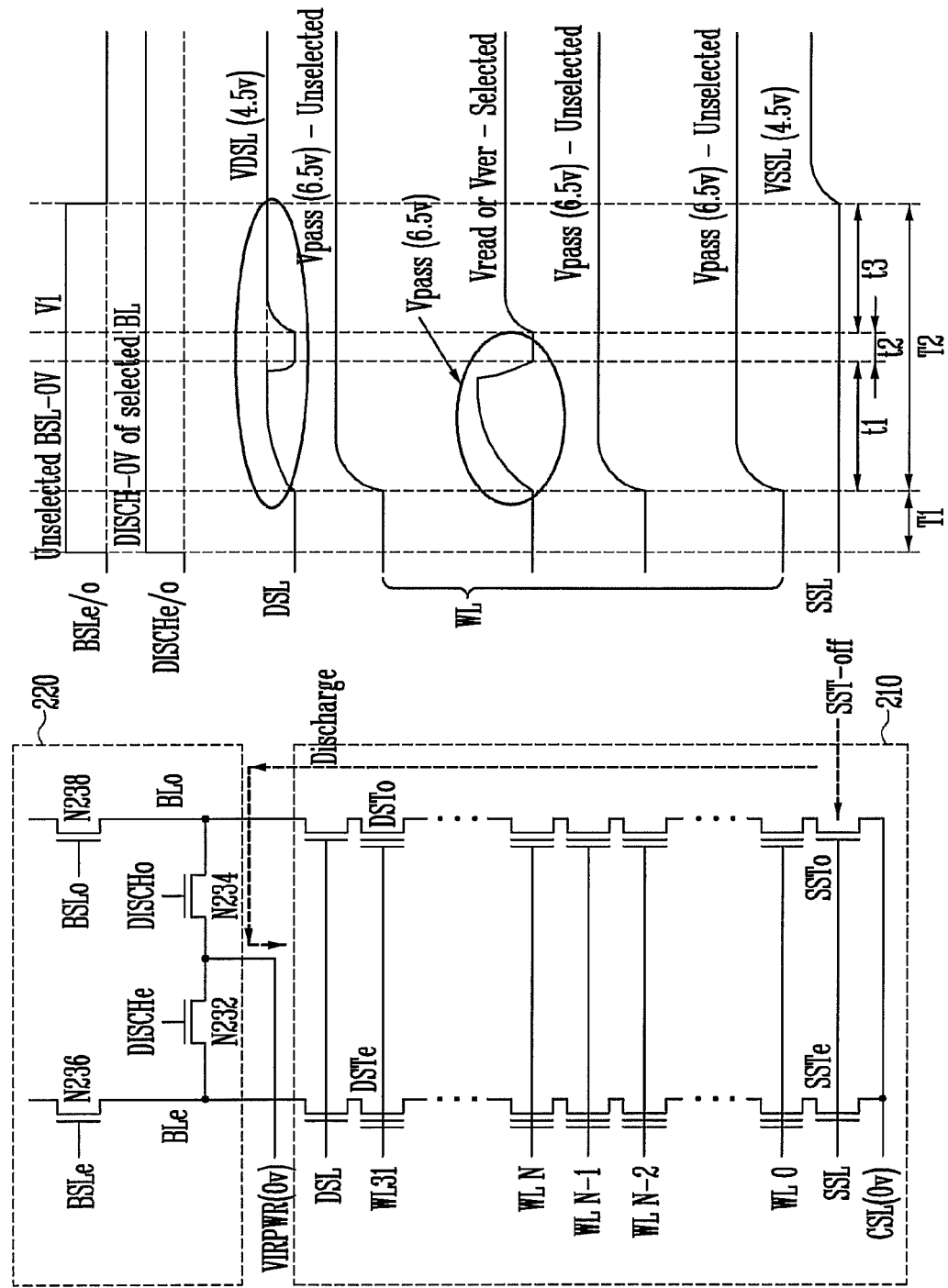
FIG. 5 is a diagram illustrating a read operation or a verification operation of the nonvolatile memory device according to an embodiment.

FIG. 5 is a diagram illustrating a read operation or a verification operation of the nonvolatile memory device according to an embodiment.

One or more embodiments prevent a disturbance phenomenon in which the threshold voltage level of a memory cell coupled to an unselected bit line increases during a read operation or a verification operation.

To this end, a method of supplying word lines with a drain select signal DSL, a pass voltage Vpass, and a reference voltage Vread or Vver is used.

(1) Period T1

First, a bit line coupled to a cell to be read/verified (i.e., a selected bit line) is precharged to a logic high level. To this end, the sensing node SO is coupled to the power supply voltage terminal using the sensing node precharge unit 240. The selected bit line coupled to the cell to be read/verified is precharged to a logic high level (V1–Vth) (Vth is the threshold voltage of the NMOS transistor N236 or N238) by applying the bit line select signal BSLe or BSLo having the first voltage V1. At this time, a connection between the sensing node of a logic high level and an unselected bit line is shut off by supplying the NMOS transistor N236 or N238, coupled to the unselected bit line, with the bit line select signal BSLe or BSLo of a logic low level. Meanwhile, in a construction including the bit line sensing unit 290, the selected bit line is precharged by applying the bit line sensing signal PBSENSE having the first voltage V1.

An unselected bit line is coupled to the variable voltage input terminal VIRPWR to which the ground voltage is applied by applying the discharge signal DISCHe or DISCHo of a logic high level. That is, the unselected bit line remains in a logic low level. At this time, a connection between a selected bit line and the variable voltage input terminal VIRPWR is shut off by supplying the NMOS transistor N232 or N234, coupled to the selected bit line, with the discharge signal DISCHe or DISCHo of a logic low level.

In general, read/verification operations are independently performed on memory cells coupled to even bit lines and memory cells coupled to odd bit lines. Accordingly, in the case where read/verification operations are performed on even bit lines, the even bit lines are precharged to a logic high level, but odd bit line is discharged to a logic low level. Furthermore, in the case where read/verification operations are performed on odd bit lines, the odd bit lines are precharged to a logic high level, but even bit lines are discharged to a logic low level.

(2) Period T2

Next, the bit line precharged to the logic high level is coupled to a cell string including the cell to be read/verified. To this end, the drain select transistor DSTe or DSTo is turned on by supplying the drain select transistor with the drain select signal DSL of a logic high level so that the bit line is coupled to the cell string. At this time, a read/verification reference voltage Vread or a pass voltage Vpass may be applied to each of word lines depending on the subject of read/verification. In this case, the following operation is performed so that the cells coupled to the unselected bit line are electrically coupled from each other because of the supply of the read/verification reference voltage Vread.

(1) t1 period

First, the drain select transistor DSTe or DSTo is turned on by supplying the drain select transistor with the drain select signal DSL of a logic high level so that the bit line is coupled to the cell string. The same pass voltage Vpass is also applied to all the word lines. That is, all the memory cells are turned on by supplying the word line, coupled to the cell to be read/verified, with the pass voltage Vpass.

When a voltage of the word line rises, the voltage of the channel is inevitably boosted. Accordingly, the pass voltage Vpass is also applied to a selected word line so that boosted charges within the channels are discharged through the variable voltage input terminal VIRPWR coupled to the ground.

Here, the voltage level of the pass voltage Vpass is only illustrative and is not limited to 6.5 V. In general, a pass voltage higher than the threshold voltage of a memory cell, which is expected to be the highest, is applied. Two or more different distribution states appear both in a single level cell program method and a multi-level cell program method. Voltage higher than the highest one of the threshold voltages of the states is applied so that a memory cell is turned on irrespective of the state of the memory cell.

Meanwhile, the operation (period t1) is performed on the memory cells coupled to the unselected bit line and the memory cells coupled to the selected bit line at the same time. The selected bit line maintains a logic high level through the sensing node at this state. Thus, although all the memory cells are turned on by applying the pass voltage Vpass, the voltage level of the bit line maintains a logic high level. Accordingly, the voltage level of the selected bit line remains intact by the operation (period t1).

(2) t2 period

Next, the pass voltage applied to the selected word line is discharged in order to supply the selected word line with a reference voltage. Furthermore, the supply of the drain select signal DSL is stopped so that the connection between the bit line and the cell string is shut off.

(3) t3 period

Next, the drain select transistor DSTe or DSTo is turned on by supplying the drain select transistor with the drain select signal DSL of a logic high level so that the bit line is coupled to the cell string. The read reference voltage Vread or the verification reference voltage Vver is also applied to the word line of the cell to be read/verified, and the pass voltage Vpass is applied to the word lines of the remaining cells. This operation plays a similar role as the operation (period T2) in the method of FIG. 4. However, a disturbance phenomenon is not generated from a boost because the discharge operation has already been performed on the boosted charges in the previous period t1.

As described above, before the pass voltage or the reference voltage is applied to each of the word lines, the pass voltage is applied to all the memory cells of the word lines. Accordingly, a disturbance phenomenon generated by read/verification operations can be reduced/minimized.

Figure 6:
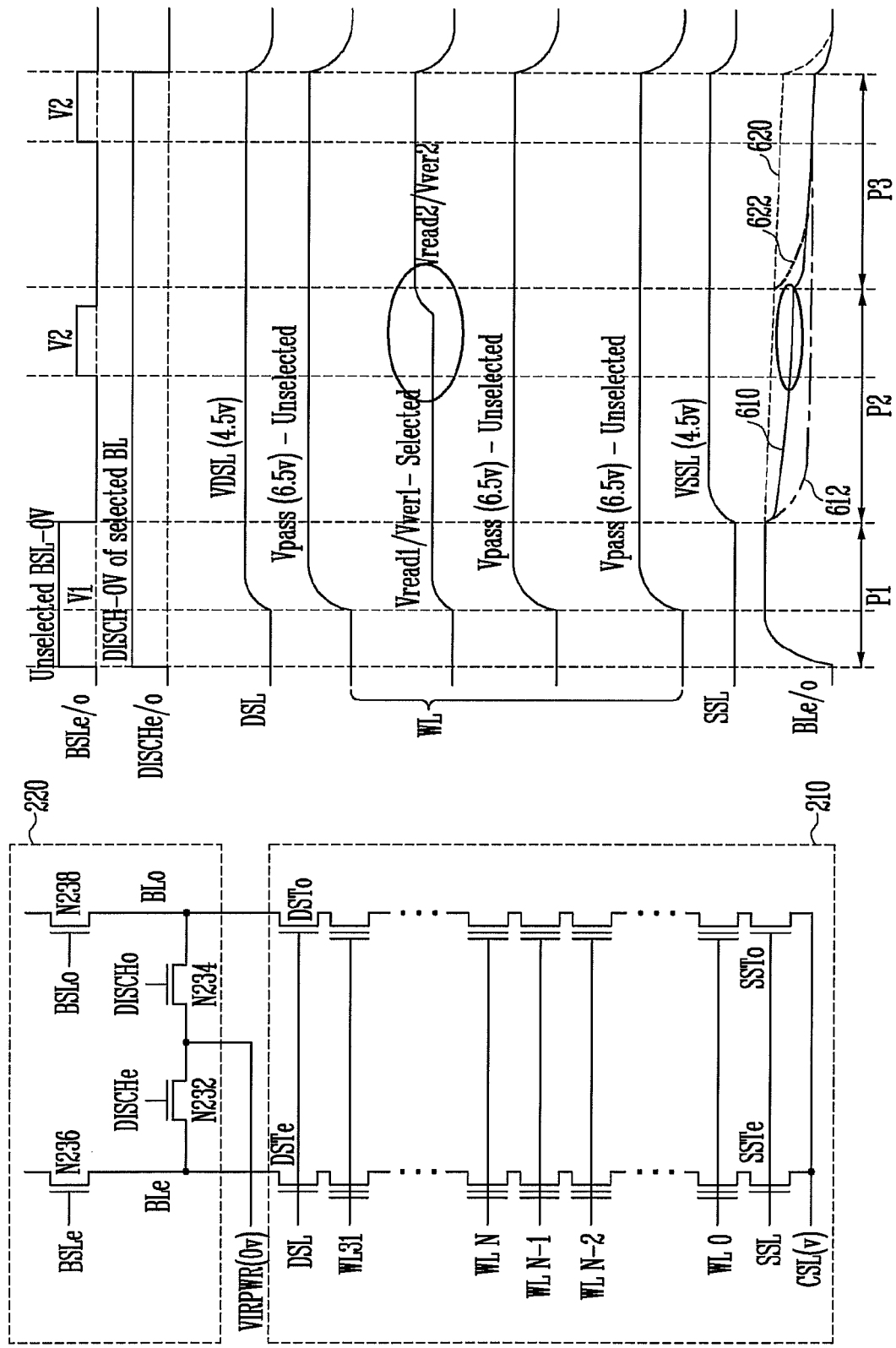
FIG. 6 is a diagram illustrating another problem occurring in the verification operation or the read operation of the known nonvolatile memory device.

FIG. 6 is a diagram illustrating another problem occurring in the verification operation or the read operation of the known nonvolatile memory device.

This figure shows a problem occurring in a verification operation or a read operation after performing a multi-level cell program of a nonvolatile memory device.

(1) Period P1

The same operations as the operations (periods T1 and T2) of FIG. 3 are performed. That is, in the state in which a selected bit line is precharged to a logic high level and an unselected bit line is grounded, the bit lines are coupled to the respective memory cell strings. The reference voltage Vread or Vver is applied to a word line coupled to a selected cell, and the pass voltage Vpass is applied to a word line coupled to an unselected cell. Here, the reference voltage applied to the word line of the selected cell is determined according to a distribution state of the threshold voltage of a cell to be read/verified. In a multi-level cell program method, three or more distributions exist. Accordingly, the distributions may have two or more corresponding, different reference voltages.

(2) Period P2

An operation for evaluating the voltage level of the bit line according to a first reference voltage applied to the word line of the selected cell (corresponding to the period T3 of FIG. 3) and an operation of sensing the voltage level of the bit line and storing it in the data latch unit (corresponding to the period T4 of FIG. 3) are performed.

(3) Period P3

An operation for evaluating the voltage level of the bit line according to a second reference voltage applied to the word line of the selected cell (corresponding to the period T3 of FIG. 3) and an operation of sensing the voltage level of the bit line and storing it in the data latch unit (corresponding to the period T4 of FIG. 3) are performed. Unlike in the previous period P2, the reference voltage applied to the word line of the selected cell varies.

As described above, in a verification operation or a read operation of a nonvolatile memory device shown in FIG. 6, the voltage level of a reference voltage varies according to the state of a cell to be read/verified, and the operation for evaluating the voltage level of the bit line (corresponding to the period T3 of FIG. 3) and the operation of sensing the voltage level of the bit line and storing it in the data latch unit (corresponding to the period T4 of FIG. 3) are repeatedly performed. That is, after a bit line precharge operation is performed once, the evaluation operation P2 and the sensing operation P3 are performed several times.

However, this operation has the following problem.

For example, it is assumed that a read operation is performed on a cell programmed with a first reference voltage Vread1 or more and a cell programmed with a second reference voltage Vread2 or more. Alternatively, it is assumed that a verification operation is performed on a cell to be programmed with a first reference voltage Vread1 or more and a cell to be programmed with a second reference voltage Vread2 or more. Here, the second reference voltage Vread2 is higher than the first reference voltage Vread1.

In the period P2, the voltage level of the bit line is evaluated and data is sensed on the basis of the first reference voltage. However, the cell programmed with the second reference voltage or more is also coupled to the cell coupled to the word line to which the first reference voltage is applied.

Accordingly, in a period where the voltage level of the bit line is evaluated, a bit line voltage 612 of a cell programmed with the first reference voltage or less shifts to a logic low level, and a bit line voltage 610 of the cell programmed with the first reference voltage or more ideally remains in a logic high level. In this case, the voltage level of the threshold voltage of the cell may be slightly lower than the voltage level of the threshold voltage of the cell, precharged in the period P1, because of the leakage current, etc. of the bit line. Meanwhile, the threshold voltage of the cell programmed with the second reference voltage or more is higher than the threshold voltage of the cell programmed with the first reference voltage or more. Accordingly, the bit line voltage 620 of the cell programmed with the second reference voltage or more may be higher than the bit line voltage of the cell programmed with the first reference voltage or more.

Meanwhile, a period where data is stored in the data latch unit as the bit line select signal BSLe or BSLo or the bit line sensing signal PBSENSE having a second voltage is applied (i.e., a sensing period) continues not only in the cell programmed with the first reference voltage or more, but the cell programmed with the second reference voltage or more. Accordingly, a period where a bit line voltage level is evaluated for cells programmed with the second reference voltage or more is substantially lengthened. Consequently, the amount of charges discharged through the common source line, etc. is increased. Although, since the first reference voltage is applied to the word lines coupled to the cells programmed with the second reference voltage or more, the corresponding cells are turned off, the leakage current through the common source line of a ground state may not be fully shut off.

Accordingly, if, after the operation (period P2) has been performed, a read operation is performed by supplying the word line of the selected cell with the second reference voltage, the bit line voltage 620 of the cell programmed with the second reference voltage or more can be lowered significantly. Consequently, the voltage level of the bit line may be evaluated differently from an actual threshold voltage of the cell.

Furthermore, the time that the voltage of the word line takes to rise from the first reference voltage to the second reference voltage may differ according to the voltage level of the second reference voltage. Accordingly, the time taken for the evaluation operation in the second read operation (P3) differs. Since the voltage level of the bit line may differ according to the time taken for the evaluation operation, sensed data may differ. In particular, in the case where a verification operation is performed, whether a program pulse will be applied once more is determined according to the result of the verification operation. Accordingly, in the case where a cell is verified otherwise although the cell has been programmed with a reference voltage or more, there is a probability that over-program may occur because the program pulse is applied once more. However, in the case where a cell is verified as being programmed with a reference voltage or more although the cell has been programmed with the reference voltage or less, there is a probability that under-program may occur.

FIG. 7 is a diagram illustrating a read operation or a verification operation of the nonvolatile memory device according to another embodiment.

(1) Period P1

The same operations as the operations (periods T1 and T2) of FIG. 3 are performed. That is, in the state in which a selected bit line is precharged to a logic high level and an unselected bit line is grounded, the bit lines are coupled to the respective memory cell strings. The reference voltage Vread or Vver is applied to a word line coupled to a selected cell, and the pass voltage Vpass is applied to a word line coupled to an unselected cell. Here, the reference voltage applied to the word line of the selected cell is determined according to a distribution state of the threshold voltage of a cell to be read/verified. In a multi-level cell program method, three or more distributions exist. Accordingly, the distributions have two or more corresponding, different reference voltages.

(2) Period P2

An operation for evaluating the voltage level of the bit line according to a first reference voltage Vread1 or Vver1 applied to the word line of the selected cell (corresponding to the period T3 of FIG. 3) and an operation of sensing the voltage level of the bit line and storing it in the data latch unit (corresponding to the period T4 of FIG. 3) are performed.

At this time, in a period where the bit line select signal BSLe or BSLo or the bit line sensing signal PBSENSE having a second voltage is applied (i.e., a sensing period), the supply of the source select signal SSL of the logic high level is stopped.

As described above, the source select signal SSL is used to connect a cell string and the common source line of a ground state so that the voltage level of a bit line is discharged according to the threshold voltage of a selected cell. At this time, in the sensing period, the supply of the source select signal SSL is stopped in order to prevent the voltage level of the bit line from shifting to a logic low level.

In the period where the voltage level of the bit line is evaluated, cells programmed with the first reference voltage or less have already been discharged to a logic low level. Accordingly, it is not necessary to maintain the source select signal SSL of a logic high level. If the source select signal SSL remains in the logic high level, there is a probability that a bit line voltage of cells programmed with the second reference voltage or less may be discharged. Accordingly, this probability can be prevented. As shown in the figure, since the supply of the source select signal SSL is stopped, a bit line voltage 724 of cells programmed with the second reference voltage or less is no longer discharged, but remains intact.

(3) Period P3

An operation for evaluating the voltage level of the bit line according to a second reference voltage applied to the word line of the selected cell (corresponding to the period T3 of FIG. 3) and an operation of sensing the voltage level of the bit line and storing it in the data latch unit (corresponding to the period T4 of FIG. 3) are performed. Unlike in the previous period P2, a second reference voltage Vread2 or Vver2 is applied to the word line of the selected cell.

Furthermore, the cell string and the common source line are coupled together by applying the source select signal SSL of a logic high level again. Here, a point of time at which the source select signal SSL of a logic high level is applied again is identical to a point of time at which an increase of the second reference voltage Vread2 or Vver2 is completed. As described above, the time taken for an evaluation period varies because a point of time at which the second reference voltage rises generally varies according to its voltage level. To solve this problem, after an increase of the second reference voltage Vread2 or Vver2 is completed, the source select signal SSL of a logic high level is applied.

This is for performing an operation for evaluating the voltage level of a bit line by applying the source select signal SSL of the logic high level again. Accordingly, there is a difference in a bit line voltage 720 of cells programmed with the second reference voltage or more and bit line voltages 710, 712, and 723 of cells not programmed with the second reference voltage or more.

Next, in a period where the bit line select signal BSLe or BSLo or the bit line sensing signal PBSENSE having a second voltage is applied (i.e., a sensing period), the supply of the source select signal SSL of the logic high level is stopped.

Beyond what's shown in the figure, this operation may also be applied to a 2-bit multi-level cell program operation or a 3-bit multi-level cell program operation in which three or more reference voltages are applied. That is, a read or verification operation is performed on a reference-voltage basis, wherein the source select signal of a logic low level is in common applied in each sensing period.

As described above, a phenomenon in which the memory cells coupled to an unselected bit line can be prevented from being electrically coupled from each other by voltage applied to a selected word line during a read or verification operation. Accordingly, a read disturbance phenomenon can be prevented because boosted charges are discharged by applying a pass voltage.

Furthermore, in a nonvolatile memory device using a multi-level cell program method, the voltage level of a bit line can be prevented from varying because of external factors during a read operation and a verification operation which are consecutively performed. Moreover, points of time at which reference voltages following a first reference voltage are applied to a selected word line are made to be the same. Accordingly, since a phenomenon in which a threshold voltage can be prevented from being measured differently from an actual threshold voltage, an over-program phenomenon or an under-program phenomenon can be prevented.

What is claimed is:

1. An operating method in a read or verification operation of a nonvolatile memory device, the method comprising:

precharging selected bit lines to a logic high level and, concurrently, discharging unselected bit lines to a logic low level;

coupling the selected and unselected bit lines to respective memory cell strings and, concurrently, supplying word lines with a pass voltage;

shutting off the connection between the selected and unselected bit lines and the respective memory cell strings and, concurrently, supplying a selected word line with a ground voltage; and coupling the selected and unselected bit lines and the respective memory cell strings and, concurrently, supplying the selected word line with a reference voltage and an unselected word line with the pass voltage.

2. The operating method of claim 1, wherein the precharging of the selected bit lines to the logic high level and the discharging of the unselected bit lines to the logic low level comprises:

precharging a sensing node to a logic high level; and coupling the sensing node and the selected bit lines by supplying a bit line select unit with a bit line select signal having a first voltage.

3. The operating method of claim 1, wherein the precharging of the selected bit lines to the logic high level and the discharging of the unselected bit lines to the logic low level comprises:

precharging a sensing node to a logic high level; and coupling the sensing node and the selected bit lines by supplying a bit line sensing unit with a bit line sensing signal having a first voltage.

4. The operating method of claim 1, wherein the precharging of the selected bit lines to the logic high level and the discharging of the unselected bit lines to the logic low level comprises coupling a variable voltage input terminal and the unselected bit lines by supplying a bit line select unit with a discharge signal of a logic high level.

5. The operating method of claim 1, wherein the connection of the selected and unselected bit lines to the respective memory cell strings and the supply of the pass voltage to the word lines comprises turning on drain select transistors by supplying the drain select transistors with a drain select signal of a logic high level.

6. The operating method of claim 1, wherein the connection of the selected and unselected bit lines to the respective memory cell strings and the supply of the pass voltage to the word lines comprises, when a voltage of a word line rises, discharging boosted charges occurring in a channel of memory cells coupled to the unselected bit lines.

7. The operating method of claim 4, wherein the connection of the selected and unselected bit lines to the respective memory cell strings and the supply of the pass voltage to the word lines comprises, when a voltage of a word line rises, discharging boosted charges, occurring in channels of memory cells coupled to the unselected bit lines, to the variable voltage input terminal.

8. The operating method of claim 1, wherein the connection of the selected and unselected bit lines and the respective memory cell strings and the supply of the selected word line with the reference voltage and the unselected word line with the pass voltage comprises:

supplying the selected word line with a read reference voltage; and turning on memory cells coupled to the unselected word line by supplying the unselected word line with a pass voltage higher than the read reference voltage.

9. The operating method of claim 1, wherein the connection of the selected and unselected bit lines and the respective memory cell strings and the supply of the selected word line with the reference voltage and the unselected word line with the pass voltage comprises:

supplying the selected word line with a verification reference voltage; and turning on memory cells coupled to the unselected word line by supplying the unselected word line with a pass voltage higher than the verification reference voltage.

10. The operating method of claim 2, further comprising shutting off the connection of the selected bit lines and the sensing node and, concurrently, coupling each of the memory cell strings and a grounded common source line by supplying a source select transistor with a source select signal of a logic high level.

11. An operating method used in a read or verification operation of a nonvolatile memory device, the method comprising:

precharging first bit lines to a logic high level and, concurrently, discharging second bit lines to a logic low level;

coupling the first and second bit lines to respective memory cell strings and, concurrently, supplying word lines coupled to the memory cell stings with a pass voltage;

shutting off the connection between the first and second bit lines and the respective memory cell strings and, concurrently, supplying a selected word line with a ground voltage; and coupling the selected and unselected bit lines and the respective memory cell strings and, concurrently, supplying the selected word line with a reference voltage and an unselected word line with the pass voltage.

12. The operating method of claim 11, wherein the connection of the first and second bit lines to the respective memory cell strings and the supply of the pass voltage to the word lines comprises, when a voltage of a word line rises, discharging boosted charges occurring in channels of memory cells coupled to the second bit lines.

13. An operating method used in a read or verification operation of a nonvolatile memory device, the method comprising:

coupling selected bit lines and a sensing node of a logic high level so that the selected bit lines are precharged;

coupling the selected bit lines and respective memory cell strings and, concurrently, supplying a selected word line with a first reference voltage and an unselected word line with a pass voltage;

in a first evaluation step, shutting off the connection between the selected bit lines and the sensing node, coupling each of the memory cell strings and a common source line of a ground state, and evaluating a voltage level of a bit line coupled to a cell to be read according to a threshold voltage of the cell;

in the first evaluation step, coupling the bit lines and a sensing node of a floating state, shutting off the connection between each of the memory cell strings and the common source line, and sensing a voltage level of the sensing node according to the voltage level of the bit line evaluated in the first evaluation step;

in a second evaluation step, shutting off the connection between the selected bit lines and the sensing node, supplying the selected word line with a second reference voltage, coupling each of the memory cell strings and the common source line of a ground state, and evaluating a voltage level of a bit line coupled to a cell to be read according to a threshold voltage of the cell; and in the second evaluation step, coupling the bit lines and the sensing node of a floating state, shutting off the connection between each of the memory cell strings and the common source line, and sensing a voltage level of the sensing node according to the voltage level of the bit line evaluated in the second evaluation step.

14. The operating method of claim 13, wherein the connection of the selected bit lines and the sensing node of the logic high level so that the selected bit lines are precharged comprises connecting the sensing node and the selected bit lines by supplying a bit line select unit with a bit line select signal having a first voltage.

15. The operating method of claim 13, wherein the connection of the selected bit lines and the sensing node of the logic high level so that the selected bit lines are precharged comprises supplying a bit line sensing unit with a bit line sensing signal having a first voltage so that the sensing node and the selected bit line are connected to each other.

16. The operating method of claim 13, wherein the connection of the selected bit lines and the respective memory cell strings and the supply of the selected word line with the first reference voltage and the unselected word line with the pass voltage comprises:
  supplying the selected word line with a first reference voltage; and
  turning on a memory cell coupled to the unselected word line by supplying the unselected word line with a pass voltage higher than the first reference voltage.

17. The operating method of claim 13, wherein the first evaluation step of shutting off the connection between the selected bit lines and the sensing node, coupling each of the memory cell strings and the common source line of the ground state, and evaluating the voltage level of the bit line coupled to the cell to be read according to the threshold voltage of the cell comprises:
  when the threshold voltage of the cell to be read is lower than the first reference voltage, the corresponding cell being turned on so that the voltage level of the bit line shifts to a logic low level; and
  when the threshold voltage of the cell to be read is higher than the first reference voltage, the corresponding cell being turned off so that the voltage level of the bit line remains in a logic high level.

18. The operating method of claim 13, wherein the first evaluation step of shutting off the connection between the selected bit lines and the sensing node, coupling each of the memory cell strings and the common source line of the ground state, and evaluating the voltage level of the bit line coupled to the cell to be read according to the threshold voltage of the cell comprises turning on a source select transistor, configured to selectively couple each of the memory cell strings and the common source line, by supplying the source select transistor with a source select signal.

19. The operating method of claim 13, wherein the connection of the bit lines and the sensing node of the floating state, the shut-off of the connection between each of the memory cell strings and the common source line, and the sensing of the voltage level of the sensing node according to the voltage level of the bit line evaluated in the first evaluation step comprises stopping the supply of the source select signal so that a source select transistor configured to selectively couple each of the memory cell strings and the common source line is turned off.

20. The operating method of claim 13, wherein the connection of the bit lines and the sensing node of the floating state, the shut-off of the connection between each of the memory cell strings and the common source line, and the sensing of the voltage level of the sensing node according to the voltage level of the bit line evaluated in the first evaluation step comprises:
  when the voltage level of the bit line level is in a logic high level, the sensing node remaining in the floating state; and
  when the voltage level of the bit line level is in a logic low level, the sensing node shifting to a ground state.

21. The operating method of claim 13, wherein the second evaluation step of shutting off the connection between the selected bit lines and the sensing node, supplying the selected word line with the second reference voltage, coupling each of the memory cell strings and the common source line of the ground state, and evaluating the voltage level of the bit line coupled to the cell to be read according to a threshold voltage of the cell comprises supplying the selected word line with a second reference voltage higher than the first reference voltage.

22. The operating method of claim 13, wherein the second evaluation step of shutting off the connection between the selected bit lines and the sensing node, supplying the selected word line with the second reference voltage, coupling each of the memory cell strings and the common source line of the ground state, and evaluating the voltage level of the bit line coupled to the cell to be read according to a threshold voltage of the cell comprises, at a point of time at which an increase of the second reference voltage is completed, supplying a source select transistor with a source select signal so that the source select transistor configured to selectively couple each of the memory cell strings and the common source line is turned off.

23. The operating method of claim 13, wherein the second evaluation step of shutting off the connection between the selected bit lines and the sensing node, supplying the selected word line with the second reference voltage, coupling each of the memory cell strings and the common source line of the ground state, and evaluating the voltage level of the bit line coupled to the cell to be read according to a threshold voltage of the cell comprises:
  when the threshold voltage of the cell to be read is lower than the second reference voltage, the corresponding cell being turned on so that the voltage level of the bit line shifts to a logic low level; and
  when the threshold voltage of the cell to be read is higher than the second reference voltage, the corresponding cell being turned off so that the voltage level of the bit line remains in a logic high level.

24. The operating method of claim 13, further comprising:
  in a third evaluation step, shutting off the connection of the bit lines and the sensing node, supplying the selected word line with a third reference voltage higher than the second reference voltage, coupling each of the memory cell strings and the common source line of the ground state, and evaluating a voltage level of a bit line coupled to a cell to be read according to a threshold voltage of the cell; and
  in the third evaluation step, coupling the bit lines to the sensing node of the floating state, shutting off the connection between each of the memory cell strings and the common source line, and sensing a voltage level of the sensing node sensed according to the voltage of the bit line level evaluated in the third evaluation step.

25. The operating method of claim 13, further comprising shutting off the connection of the selected bit lines and the sensing node, and, concurrently, coupling each of the memory cell strings and a grounded common source line by supplying a source select transistor with a source select signal of a logic high level.

* * * * *